United States Patent
Chen et al.

(10) Patent No.: US 12,323,704 B2
(45) Date of Patent: Jun. 3, 2025

(54) OPTICAL ELEMENT DRIVING MECHANISM

(71) Applicant: TDK TAIWAN CORP., Taoyuan (TW)

(72) Inventors: Shu-Shan Chen, Taoyuan (TW);
Chao-Chang Hu, Taoyuan (TW);
Chih-Wei Weng, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 757 days.

(21) Appl. No.: 17/553,069

(22) Filed: Dec. 16, 2021

(65) Prior Publication Data

US 2022/0196965 A1   Jun. 23, 2022

Related U.S. Application Data

(60) Provisional application No. 63/127,746, filed on Dec. 18, 2020.

(51) Int. Cl.
*G02B 7/09* (2021.01)
*G02B 7/04* (2021.01)
(Continued)

(52) U.S. Cl.
CPC .......... *H04N 23/687* (2023.01); *G02B 7/04* (2013.01); *G02B 7/09* (2013.01); *G02B 13/0015* (2013.01); *G02B 26/00* (2013.01); *G02B 26/0875* (2013.01); *G02B 27/64* (2013.01); *G02B 27/646* (2013.01); *G06F 3/016* (2013.01); *H04N 23/54* (2023.01); *H04N 23/57* (2023.01); *H10N 30/101* (2024.05); *H10N 30/802* (2023.02)

(58) Field of Classification Search
CPC .......... G02B 7/04; G02B 7/09; G02B 27/646; H04N 23/687; H04N 23/57; H04N 23/55
USPC ........................ 359/823, 824, 797
See application file for complete search history.

(56) References Cited

U.S. PATENT DOCUMENTS

| | | | | |
|---|---|---|---|---|
| 8,818,181 | B1* | 8/2014 | Hwang | G01B 7/003 |
| | | | | 324/207.2 |
| 11,029,453 | B2* | 6/2021 | Hu | G03B 17/17 |
| 2010/0053750 | A1* | 3/2010 | Noguchi | G02B 7/06 |
| | | | | 359/823 |
| 2012/0262595 | A1* | 10/2012 | Kishida | H04N 23/663 |
| | | | | 348/E5.045 |

(Continued)

FOREIGN PATENT DOCUMENTS

CN    113031194 A    6/2021

OTHER PUBLICATIONS

Office Action mailed Apr. 12, 2022 in CN Application No. 202123195343.2, 1 page.

*Primary Examiner* — Zachary W Wilkes
*Assistant Examiner* — Elizabeth M Hall
(74) *Attorney, Agent, or Firm* — Muncy, Geissler, Olds & Lowe P.C.

(57) ABSTRACT

An optical element drive mechanism is provided. The optical element drive mechanism includes an immovable part, a first movable part, and a first drive assembly. The first movable part is connected to a first optical element. The first movable part is movable relative to the immovable part. The first drive assembly drives the first movable part to move relative to the immovable part. The optical element drive mechanism is polygonal, including a first side, a second side, a third side, and a fourth side. The first side is opposite and parallel with the third side. The second side is opposite and parallel with the fourth side. The first drive assembly is disposed on the first side.

18 Claims, 15 Drawing Sheets

(51) Int. Cl.
    *G02B 13/00*     (2006.01)
    *G02B 26/00*     (2006.01)
    *G02B 26/08*     (2006.01)
    *G02B 27/64*     (2006.01)
    *G03B 5/00*     (2021.01)
    *G03B 13/36*     (2021.01)
    *G06F 3/01*     (2006.01)
    *H04N 23/54*     (2023.01)
    *H04N 23/57*     (2023.01)
    *H04N 23/68*     (2023.01)
    *H10N 30/00*     (2023.01)
    *H10N 30/80*     (2023.01)

(56) References Cited

U.S. PATENT DOCUMENTS

| | | | |
|---|---|---|---|
| 2015/0296112 A1* | 10/2015 | Park | G02B 27/646 |
| | | | 348/208.7 |
| 2017/0019572 A1* | 1/2017 | Yang | H04N 23/51 |
| 2018/0164538 A1* | 6/2018 | Lee | G03B 9/06 |
| 2019/0230257 A1* | 7/2019 | Hu | G02B 27/0972 |
| 2020/0033558 A1* | 1/2020 | Huang | H04N 23/54 |
| 2020/0132979 A1* | 4/2020 | Rho | H04N 23/55 |
| 2020/0153366 A1* | 5/2020 | I | G02B 27/646 |
| 2020/0225442 A1* | 7/2020 | Weng | G02B 27/646 |
| 2020/0260011 A1* | 8/2020 | Sasaki | G03B 5/00 |
| 2021/0203823 A1* | 7/2021 | Yu | H04N 23/55 |
| 2022/0179164 A1* | 6/2022 | Kim | G02B 7/021 |

\* cited by examiner

OPTICAL ELEMENT DRIVING MECHANISM

CROSS REFERENCE TO RELATED APPLICATIONS

This application claims the benefit of U.S. Provisional Application No. 63/127,746, filed on Dec. 18, 2020, the entirety of which is incorporated by reference herein.

BACKGROUND OF THE INVENTION

Field of the Invention

The present invention relates to a drive mechanism, and, in particular, to an optical element drive mechanism.

Description of the Related Art

As technology has developed, many electronic devices (such as tablet computers and smartphones) may be used for capturing images and recording video. The optical element and the optical element drive mechanism in the electronic device allow the user to use the electronic device to capture images and record video. When the electronic device is being used, shock or vibration may occur, and this may cause the images or video to come out blurry. Therefore, the demand for higher quality images and video is increasing.

BRIEF SUMMARY OF THE INVENTION

An optical element drive mechanism is provided. The optical element drive mechanism includes an immovable part, a first movable part, and a first drive assembly. The first movable part is connected to a first optical element. The first movable part is movable relative to the immovable part. The first drive assembly drives the first movable part to move relative to the immovable part. The optical element drive mechanism is polygonal, including a first side, a second side, a third side, and a fourth side. The first side is opposite and parallel with the third side. The second side is opposite and parallel with the fourth side. The first drive assembly is disposed on the first side.

In some embodiments, the optical element drive mechanism further includes a second movable part, a third movable part, a second drive assembly, a third drive assembly, and a fourth optical element. The second movable part is connected to a second optical element that includes an optical axis. The third movable part is connected to a third optical element. The second drive assembly drives the second movable part to move relative to the immovable part along the optical axis. The third drive assembly drives the third movable part to move relative to the immovable part along a first axis and a second axis. The first axis and the second axis are perpendicular to the optical axis. The first optical element is located between the fourth optical element and the second optical element. The second drive assembly and the third drive assembly are not disposed on the first side.

In some embodiments, the first movable part includes a first holder and an accommodation support, the first optical element is disposed on the first holder, and the accommodation support is disposed on a side of the first holder. The first drive assembly includes a guidance element, a first magnetic element, and a first coil, the first magnetic element and the guidance element are disposed in the accommodation support, the first magnetic element corresponds to the first coil to generate a first driving force. The first driving force drives the accommodation support to move, and the guidance element guides the accommodation support to move along the first axis. The first holder is driven to move relative to the immovable part around the optical axis, so that the first optical element is driven to move relative to the immovable part by the movement of the first holder to control how much light enters the first optical element.

In some embodiments, the optical element drive mechanism further includes a sensing assembly sensing the movement of the first movable part. The first sensing assembly is disposed on the first side, and the first sensing assembly includes a first reference element and a first sensing element. The first reference element is disposed in the first movable part. The first sensing element corresponds to the first reference element and disposed inside the first coil. The first sensing element includes a plurality of pins, and current is supplied to the first coil via at least two of the pins. The thickness of the first sensing element is less than the thickness of the first coil.

In some embodiments, the immovable part includes a frame disposed above the third movable part, and the second movable part is disposed in the frame. The second drive assembly is disposed on the second side and the fourth side, the second drive assembly includes a second magnetic element and a second coil, the second magnetic element is disposed in the frame, the second coil is disposed on the second movable part, the second magnetic element corresponds to the second coil to generate a second driving force, and the second driving force drives the second movable pail to move relative to the immovable part. In some embodiments, the optical element drive mechanism further includes a second sensing assembly sensing the movement of the second movable part. The second sensing assembly is disposed on the third side, and the second sensing assembly includes a second reference element and a second sensing element. The second reference element is disposed on the second movable part. The second sensing element corresponds to the second reference element, and the second sensing element is disposed on the frame.

In some embodiments, the third drive assembly includes a first axis drive assembly and a second axis drive assembly. The first axis drive assembly is disposed on the second side and the fourth side, and the second axis drive assembly is disposed on the third side. The first axis drive assembly includes a first axis magnetic element and a first axis coil, the first axis magnetic element is disposed in the frame, the first axis coil is disposed on the third movable part, the first axis magnetic element corresponds to the first axis coil to generate a first axis driving force, and the first axis driving force drives the third movable part to move relative to the immovable part along the first axis. The second axis drive assembly includes a second axis magnetic element and a second axis coil, the second axis magnetic element is disposed in the frame, the second axis coil is disposed on the third movable part, the second axis magnetic element corresponds to the second axis coil to generate a second axis driving force, and the second axis driving force drives the third movable part to move relative to the immovable part along the second axis. The first axis is perpendicular to the second axis.

In some embodiments, the optical element drive mechanism further includes a third sensing assembly sensing the movement of the third movable part. The third sensing assembly includes a first axis sensing assembly and a second axis sensing assembly, the first axis sensing assembly is disposed on the second side or the fourth side, and the second axis sensing assembly is disposed on the third side.

The first axis sensing assembly includes a first axis sensing element, and the first axis sensing element corresponds to the first axis magnetic element. There are a plurality of first coils, the first axis sensing element is disposed between the first coils, and a thickness of the first axis sensing element is less than a thickness of each of the first axis coils. The second axis sensing assembly includes a second axis sensing element, and the second axis sensing element corresponds to the second axis magnetic element. There are a plurality of second coils, the second axis sensing element is disposed between the second coils, and a thickness of the second axis sensing element is less than a thickness of each of the second axis coils.

In some embodiments, the optical element drive mechanism further includes an external connection circuit. The external connection circuit includes a plurality of external connection pins, the external connection pins are located on the second side and the third side. Among the external connection pins that are located on the second side, at least four of them are electrically connected to the first axis coils, and at least two of them are electrically connected to the second axis coils. Among the external connection pins that are located on the third side, at least four of them are electrically connected to the first axis sensing element, and at least four of them are electrically connected to the second axis sensing element.

In some embodiments, the optical element drive mechanism further includes a buffer element. The buffer element is disposed inside the frame and on the second movable part. The buffer element is disposed outside the frame and on the third movable part. The buffer element is disposed below the third movable part.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the subject matter provided. Specific examples of components and arrangements are described below to simplify this disclosure. These are, of course, merely examples and are not intended to be limiting. For example, the formation of a first feature "on" and/or "above" a second feature in the description that follows may include embodiments in which the first and second features are formed in direct contact, and may also include embodiments in which additional features may be formed between the first and second features, so that the first and second features may not be in direct contact. The spatially relative terms are intended to encompass different orientations of the device in use or operation in addition to the orientation depicted in figures. The apparatus may be otherwise oriented (rotated 90 degrees or at other orientations) and the spatially relative descriptors used herein may likewise be interpreted accordingly. In addition, in different examples of this disclosure, symbols or alphabets may be used repeatedly.

Ordinal terms such as "first", "second", etc., used in the description and in claims do not by themselves connote any priority, precedence, or order of one element over another, but are used merely as labels to distinguish one element from another element having the same name. Unless the context requires otherwise, throughout the specification and claims that follow, the word "include", "have" and variations thereof, such as "includes", "including", "having" are to be construed in an open, inclusive sense, that is, as "including, but not limited to."

Figure 1:
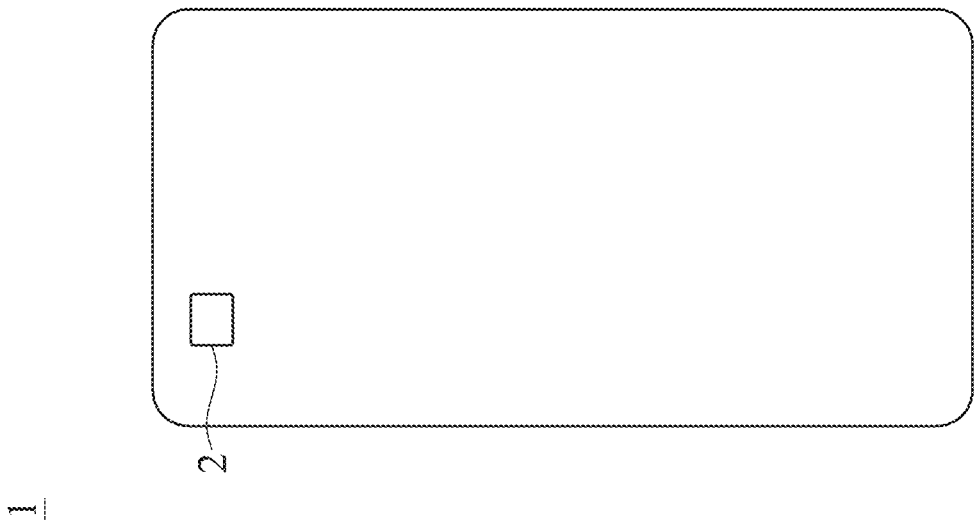
FIG. 1 is a schematic view of the electronic device and the optical system.
Figure 2:
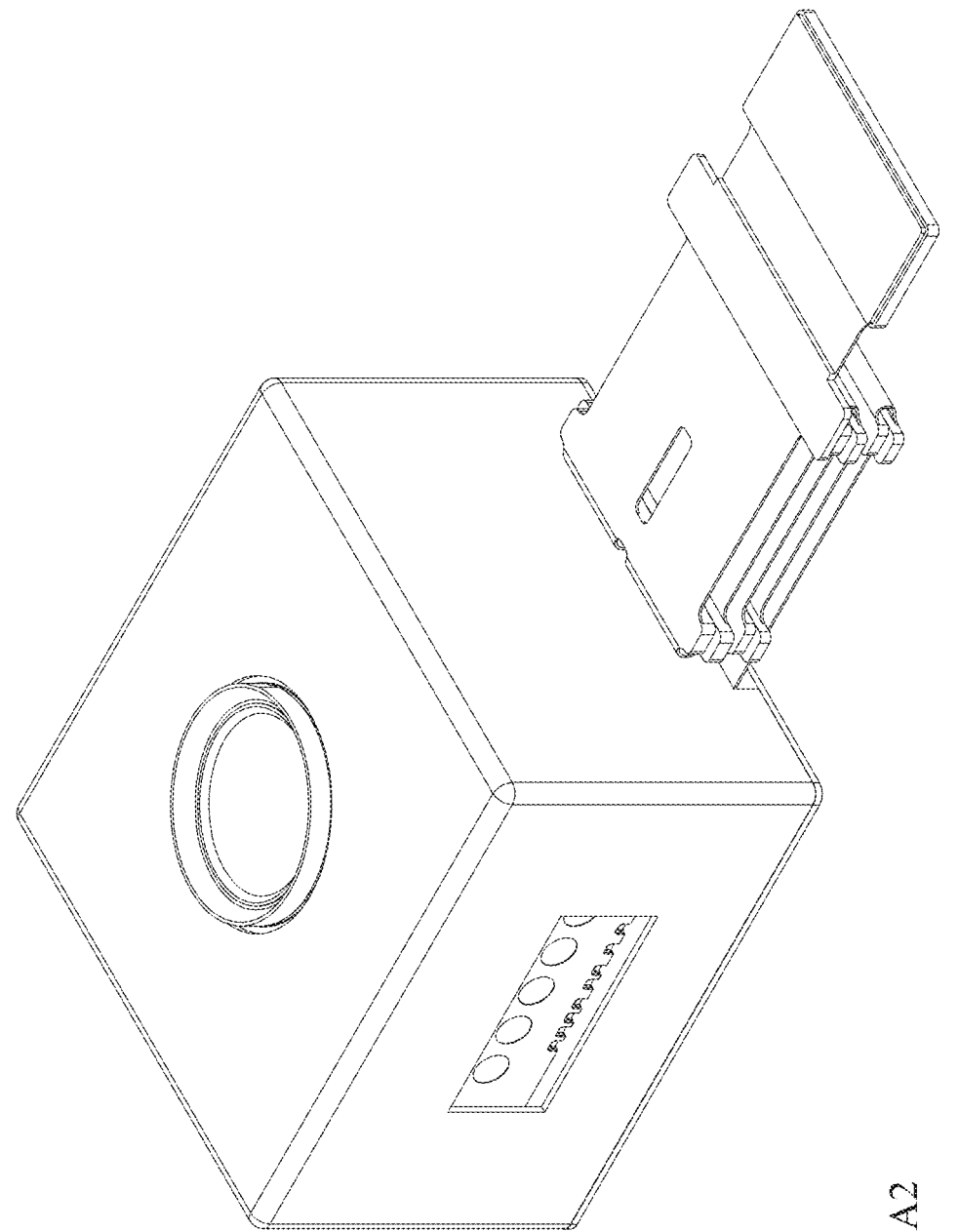
FIG. 2 is a perspective view of the optical system.

Please refer to FIG. 1 and FIG. 2. FIG. 1 is a schematic view of an electronic device 1 and an optical system 2. FIG. 2 is a perspective view of the optical system 2. The electronic device 1 may be a tablet computer, a smart phone, etc. The optical system 2 may be disposed in the electronic device 1, so that a user may capture images and record video. The optical system 2 is typically placed in the top region of the electronic device 1 to increase the display area of the electronic device 1, but it is not limited thereto.

Figure 3:
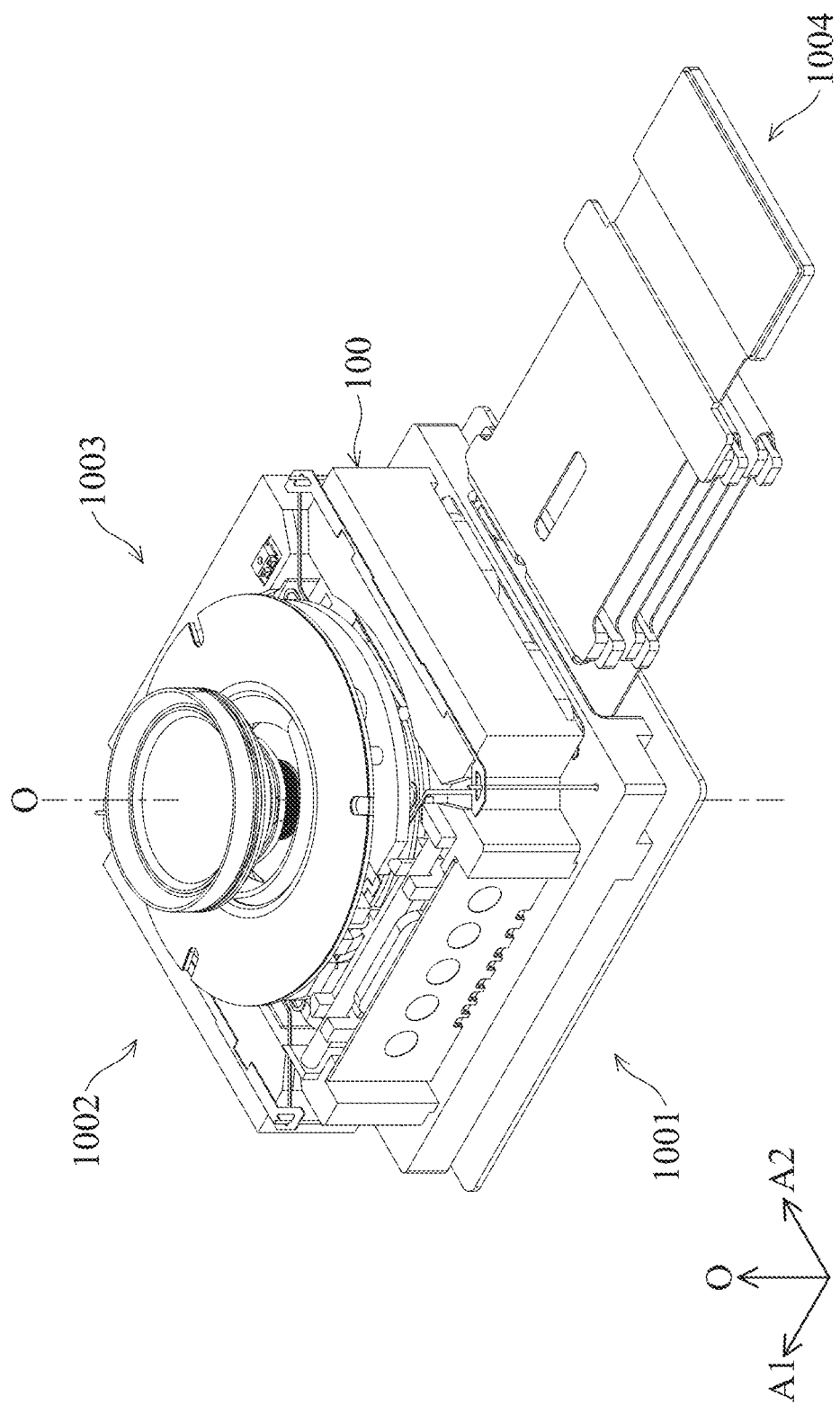
FIG. 3 is a perspective view of the optical system with some elements omitted.
Figure 4:
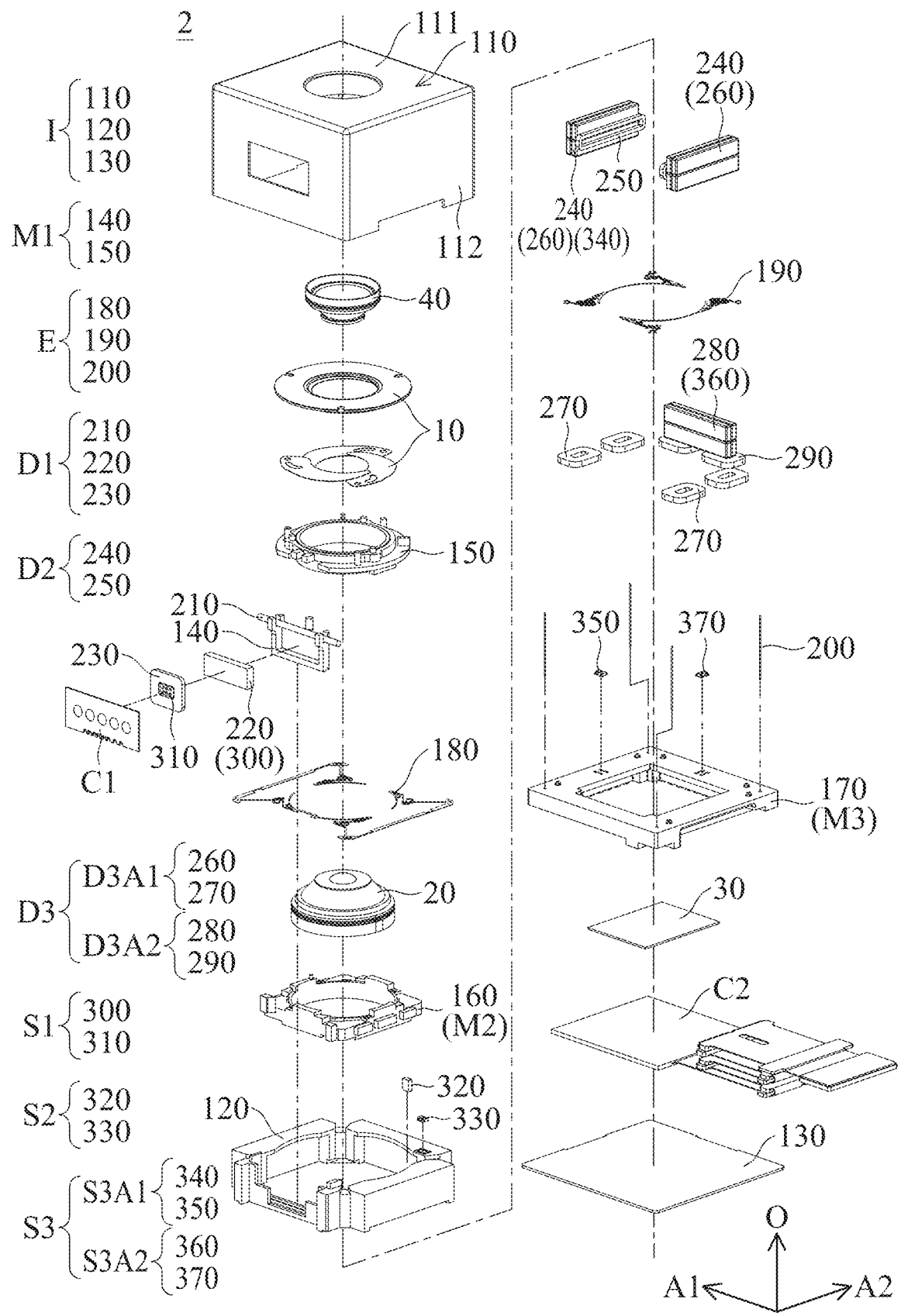
FIG. 4 is an exploded view of the optical system.

Next, please refer to FIG. 3 and FIG. 4. FIG. 3 is a perspective view of the optical system 2 with some elements omitted. FIG. 4 is an exploded view of the optical system 2. The optical system 2 includes a first optical element 10, a second optical element 20, a third optical element 30, and an optical element drive mechanism 100. The first optical element 10 may be an aperture to control the amount of light entering the first optical element 10. The second optical element 20 may be one or more lenses, and the lenses may be made of plastic materials or glasses. The area of the top side of the second optical element 20 (the side that is closer to the first optical element 10) may be less than the area of the bottom side of the second optical element 20 (the side that is farther away from the first optical element 10). The third optical element 30 may be an image sensor, such as a charge-coupled device CCD) or a complementary metal oxide semiconductor (CMOS) image sensor (CIS). The light may be converted into an image on the third optical element 30. The optical element drive mechanism 100 may drive the first optical element 10, the second optical element 20, and the third optical element 30 to move.

In some embodiments, the optical system 2 may further include a fourth optical element 40. The fourth optical element 40 is disposed above the first optical element 10, so that the first optical element 10 is located between the fourth optical element 40 and the second optical element 20. Similar to the second optical element 20, the fourth optical element 40 may be one or more lenses, and the lenses may be made of plastic materials or glasses. The area of the bottom side of the fourth optical element 40 (the side that is closer to the first optical element 10) may be less than the area of the top side of the fourth optical element 40 (the side that is farther away from the first optical element 10). In this way, in the whole optical path, the first optical element 10 is located at the portion that the cross-section is relatively small, and thus the amount of light entering the first optical element 10 may be effectively controlled. Therefore, even if the light in the environment is not sufficient, a clear image may still be captured.

The second optical element 20 has an optical axis O. The optical axis O is an imaginary axis passing through the center of the second optical element 20. When the second optical element 20 and the optical element drive mechanism 100 are aligned, the optical axis O substantially overlaps the central axis of the optical element drive mechanism 100. Therefore, in the following description and in the drawings, the optical axis O of the second optical element 20 may be used to illustrate or describe the features of the optical element drive mechanism 100. It should be noted that, since the second optical element 20 is movably connected to the optical element drive mechanism 100, the optical axis O may not exactly overlap the central axis of the optical element drive mechanism 100 because of the movement, shake, rotation, tilt, and the like, of the optical element drive mechanism 100.

When viewed along the optical axis O, the optical element drive mechanism 100 is polygonal, such as quadrilateral. For ease of illustration, the four sides of the optical element drive mechanism 100 are referred to as a first side 1001, a second side 1002, a third side 1003, and a fourth side 1004. The first side 1001 is opposite the third side 1003, and the second side 1002 is opposite the fourth side 1004. The first side 1001 is substantially parallel with the third side 1003, and the second side 1002 is substantially parallel with the fourth side 1004. The first side 1001, the second side 1002, the third side 1003, and the fourth side 1004 are substantially perpendicular to the optical axis O. When viewed along the optical axis O, the first side 1001 and the third side 1003 are parallel with a first axis A1, and the first side 1001 and the third side 1003 extend along the first axis A1. When viewed along the optical axis O, the second side 1002 and the fourth side 1004 are parallel with a second axis A2, and the second side 1002 and the fourth side 1004 extend along the second axis A2. The first axis A1 and the second axis A2 are substantially perpendicular to the optical axis O.

The optical element drive mechanism 100 includes an immovable part I, a first movable part M1, a second movable part M2, a third movable part M3, an elastic assembly E, a first drive assembly D1, a second drive assembly D2, a third drive assembly D3, a first sensing assembly S1, a second sensing assembly S2, a third sensing assembly S3, a first circuit assembly C1, and a second circuit assembly C2.

The first movable part M1 may be connected to the first optical element 10. The second movable part M2 may be connected to the second optical element 20. The third movable part M3 may be connected to the third optical element 30. The first drive assembly D1 may drive the first optical element 10 to move, and thus the amount of light entering the first optical element 10 may be under control. The second drive assembly D2 may drive the second movable part M2 to move relative to the immovable part I along the optical axis O, so an object may be in focus to achieve auto focus (AF). The third drive assembly D3 may drive the third movable part M3 to move relative to the immovable part I along the first axis A1 and the second axis A2 to compensate for a deviation in the image caused by shaking or being impacted, and to solve the problem of blurry images and videos, thereby achieve optical image stabilization (OIS). The first sensing assembly S1 may sense the movement of the first movable part M1. The second sensing assembly S2 may sense the movement of the second movable part M2. The third sensing assembly S3 may sense the movement of the third movable part M3. The first circuit assembly C1 and the second circuit assembly C2 may transmit current.

The immovable part I includes a case 110, a frame 120, and a bottom 130. The first movable part M1 includes an accommodation support 140 and a first holder 150. The second movable part M2 includes a second holder 160. The third holder M3 includes a third holder 170. The elastic assembly E includes a first elastic element 180, a plurality of second elastic elements 190, and a plurality of third elastic elements 200. The first drive assembly D1 includes a guidance element 210, a first magnetic element 220, and a first coil 230. The second drive assembly D2 includes a plurality of second magnetic elements 240 and a plurality of second coils 250. The third drive assembly D3 may be divided into a first axis drive assembly D3A1 and a second axis drive assembly D3A2. The first axis drive assembly D3A1 includes a plurality of first axis magnetic elements 260 and a plurality of first axis coils 270. The second axis drive assembly D3A2 includes a second axis magnetic element 280 and a plurality of second axis coils 290. The first sensing assembly S1 includes a first reference element 300 and a first sensing element 310. The second sensing assembly S2 includes a second reference element 320 and a second sensing element 330. The third sensing assembly S3 may be divided into a first axis sensing assembly S3A1 and a second axis sensing assembly S3A2. The first axis sensing assembly S3A1 includes a first axis reference element 340 and a first axis sensing element 350. The second axis sensing assembly S3A2 includes a second axis reference element 360 and a second axis sensing element 370. It should be noted that elements may be added or removed as needed. Also, for a clear illustration, some elements may be omitted from the drawings.

Figure 5:
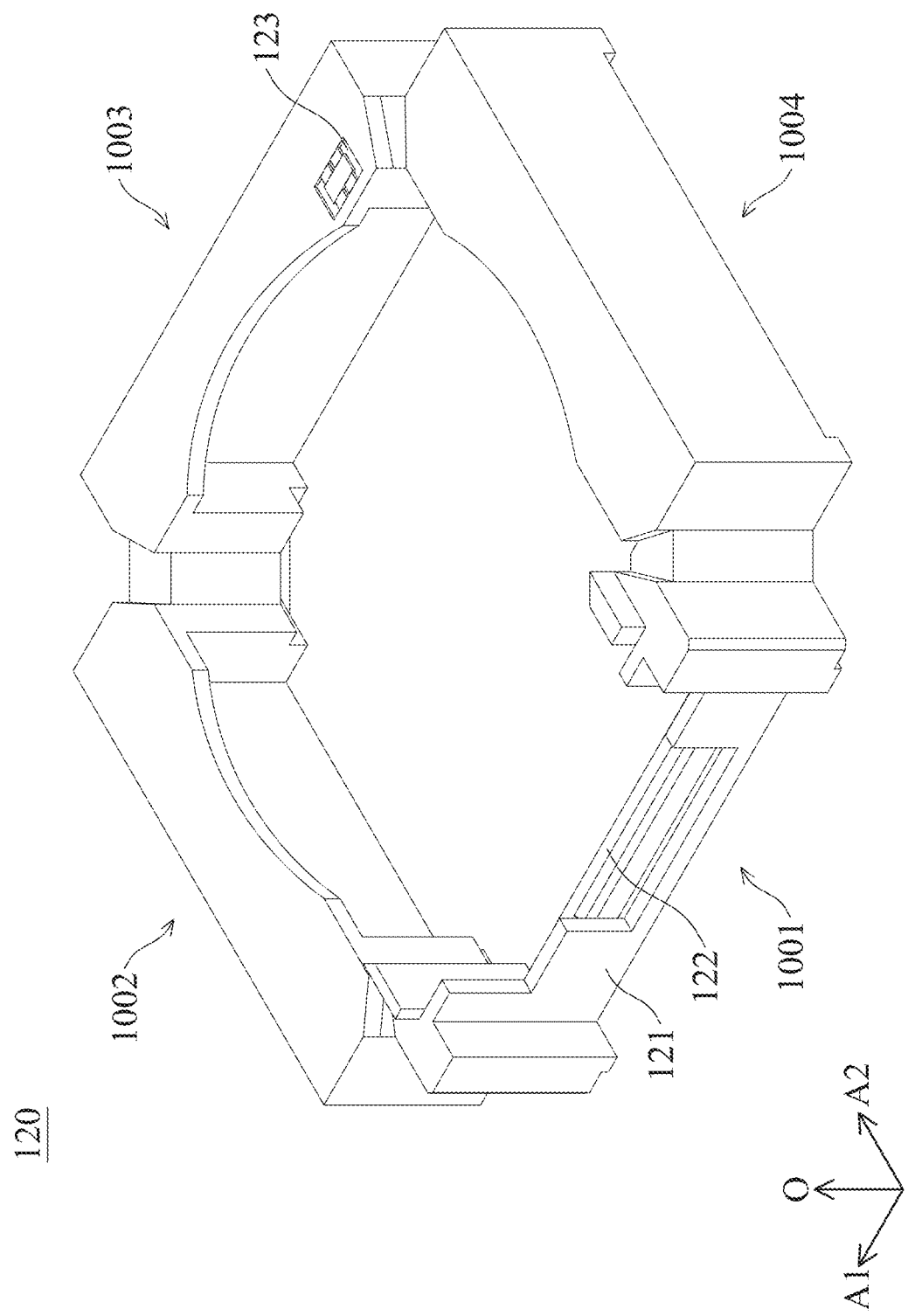
FIG. 5 is a perspective view of the frame.

Next, in addition to FIG. 2 to FIG. 4, please also refer to FIG. 5 to know the immovable part I. FIG. 5 is a perspective view of the frame 120. The case 110 may be connected to the bottom 130, and thus an accommodation space is formed between the case 110 and the bottom 130. The accommodation space may accommodate the frame 120, the first movable part M1, the second movable part M2, the third movable part N3, the elastic assembly E, the first drive assembly D1, the second drive assembly D2, the third drive assembly D3, the first sensing assembly S1, the second sensing assembly S2, the third sensing assembly S3, the first circuit assembly C1, the second circuit assembly C2, and the like to increase the overall structural strength of the optical element drive mechanism 100. The case 110 includes a top wall 111 and a plurality of side walls 112. The top wall 111 is perpendicular to the optical axis O. Each of the side walls 112 extend along the optical axis O from the edge of the top wall 111.

The frame 120 is disposed above the third movable part M3. The frame 120 includes a frame support portion 121, a frame accommodation portion 122, and a frame concave portion 123. The frame support portion 121 and the frame accommodation portion 122 are located on the first side 1001. The frame concave portion 123 is formed on the top surface of the frame 120. The first circuit assembly C1 is in contact with the frame support portion 121. The accommodation support 140 is disposed in the frame accommodation portion 122. The second sensing element 330 is disposed on the frame concave portion 123.

Figure 6:
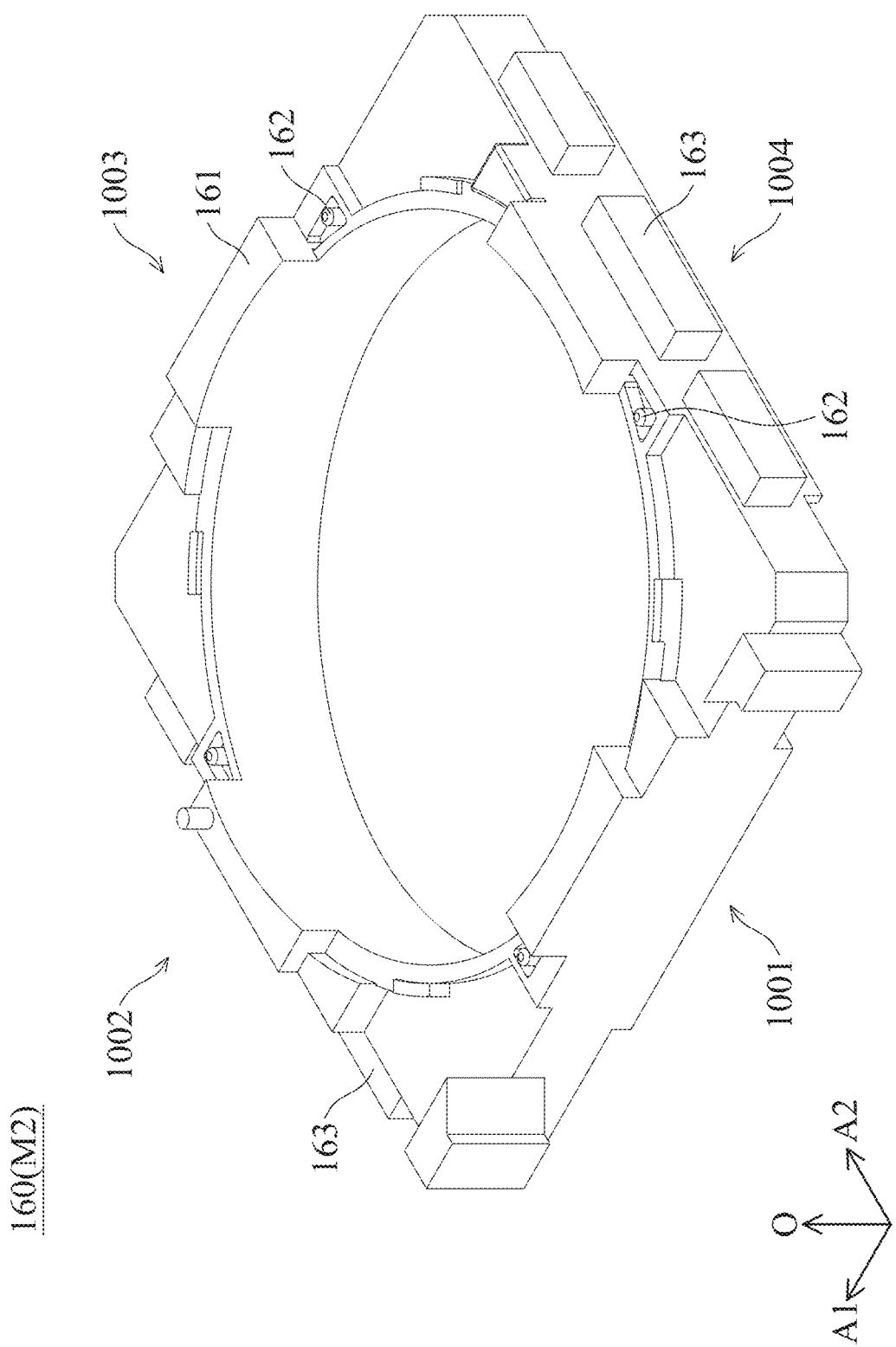
FIG. 6 is a perspective view of the second holder.

Next, in addition to FIG. 2 to FIG. 4, please also refer to FIG. 6 to know the second movable part M2. FIG. 6 is a perspective view of the second holder 160. The second holder 160 is disposed in the frame 120. The second holder 160 is connected to the frame 120 via the first elastic element 180 and the second elastic elements 190. The second holder 160 is hollow for receiving the second optical element 20. The second holder 160 includes a plurality of stopper-portions 161, a plurality of connection portions 162, and a plurality of electrical connection portions 163. The stopper-portions 161 and the connection portions 162 are disposed on the top surface of the second holder 160. The stopper-portions 161 and the connection portions 162 may be protrusions. The electrical connection portions 163 are located on the second side 1002 and the fourth side 1004. When the second drive assembly D2 drives the second holder 160 to move along the optical axis O toward the top wall 111 of the case 110 and to reach the limit, the stopper-portions 161 may be in contact with the top wall 111 of the case 110 first so as to prevent the rest of the portions of the second holder 160 from colliding with the case 110. Similar stopper-portions may also be placed on the bottom surface of the bottom surface of the second holder 160. Therefore, the stability of the overall optical element drive mechanism 100 is enhanced.

Figure 7:
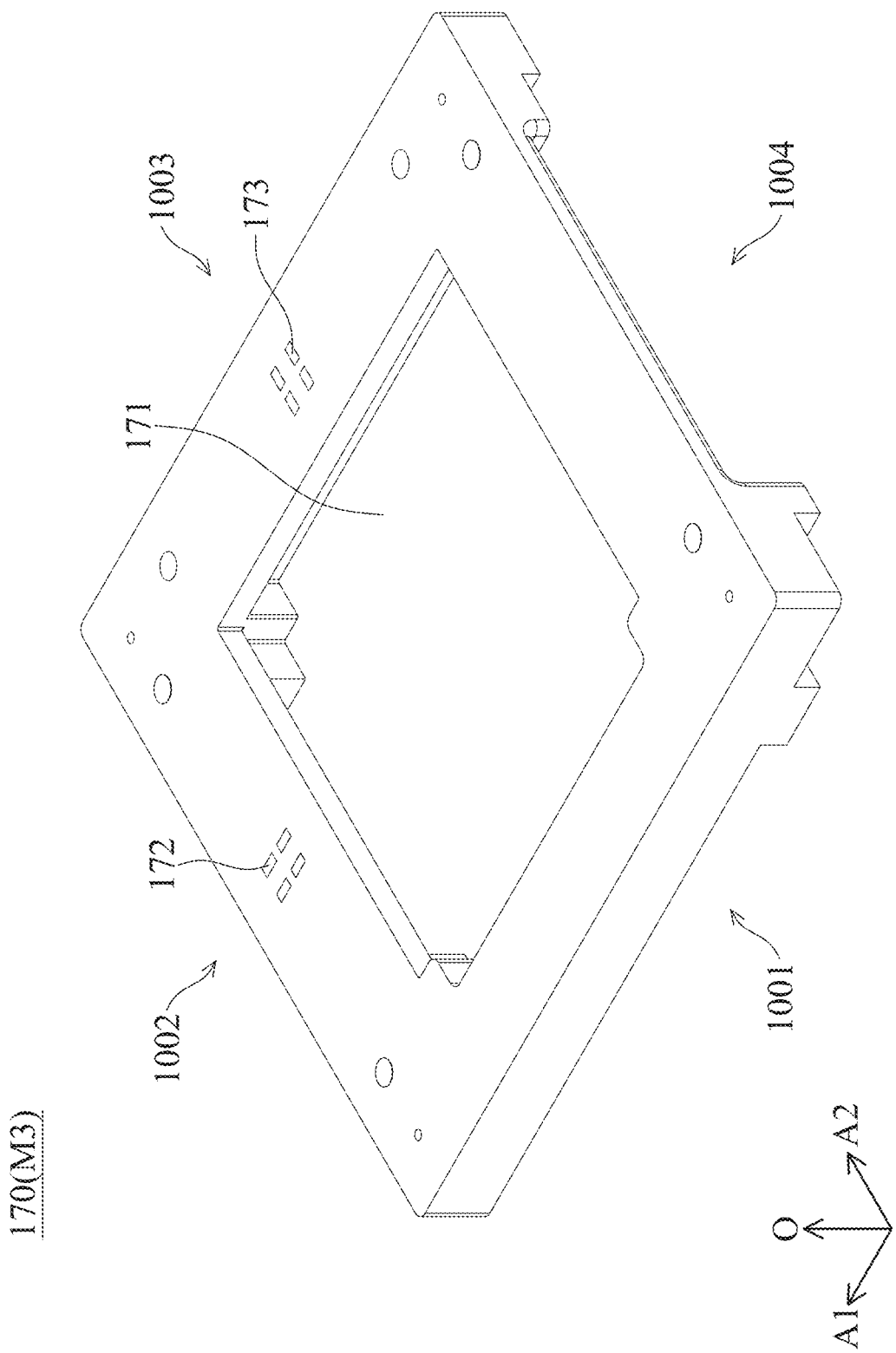
FIG. 7 is a perspective view of the third holder.

Next, in addition to FIG. 2 to FIG. 4, please also refer to FIG. 7 to know the third movable part M3. FIG. 7 is a perspective view of the third holder 170. The circuits may be formed in the third holder 170 by insert molding. The third holder 170 includes a hollow portion 171 and two third holder concave portions 172, 173. The hollow portion 171 may accommodate the third optical element 30. The third holder concave portions 172, 173 are formed on the top surface of the third holder 170. The third holder concave portion 172 is located on the second side 1002. The third holder concave portion 172 is located on the third side 1003. The first axis sensing element 350 is disposed on the third holder concave portion 172. The second axis sensing element 370 is disposed on the third holder concave portion 173.

Next, please refer back to FIG. 2 to FIG. 4 to know elastic assembly E. The first elastic element 180 is disposed between the top wall 111 of the case 110 and the frame 120. The second elastic element 190 is disposed between the frame 120 and the third movable part M3. The first elastic element 180 and the second elastic element 190 are made of an elastic material or a ductile material. e.g., metal. In this technical field, the first elastic element 180 and the second elastic element 190 may be known as "spring", "leaf spring", "plate spring", etc.

The first elastic element 180 connects the top surface of the frame 120 and the top surface of the second holder 160, and the second elastic element 190 connects the bottom surface of the frame 120 and the bottom surface of the second holder 160. For example, the first elastic element 180 may be disposed on the connection portions 162. When the second movable part M2 moves relative to the immovable part I, the range of motion of the second holder 160 may be restricted by the first elastic element 180 and the second elastic element 190. Therefore, the second holder 160 and the second optical element 20 therein do not get damaged because of collision of the second holder 160 with the case 110 or the frame 120 when the optical element drive mechanism 100 moves or is impacted.

The upper ends of the four third elastic elements 200 are connected to the first elastic element 180, and the lower ends of the four third elastic elements 200 are connected to the third movable part M3. With the flexible third elastic elements 200, the movement of the third movable part M3 together with the third optical element 30 are two-dimensional in directions that are perpendicular to the optical axis O. In some other embodiments, the third elastic elements 200 may be omitted, and the third movable part M3 is supported by other support elements such as balls.

Figure 8:
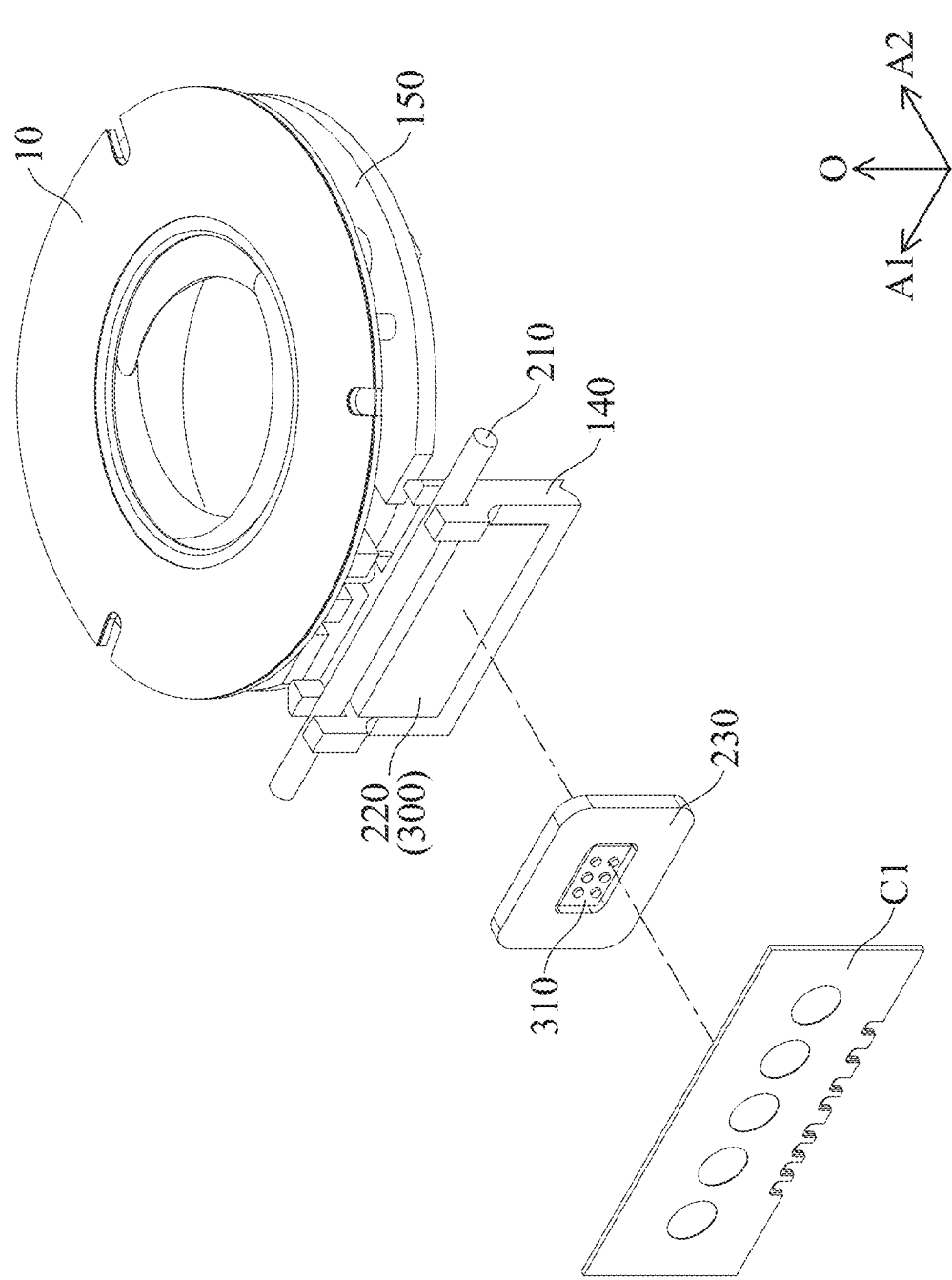
FIG. 8 and FIG. 9 are schematic views illustrating the driving and sensing of the first movable part.
Figure 9:
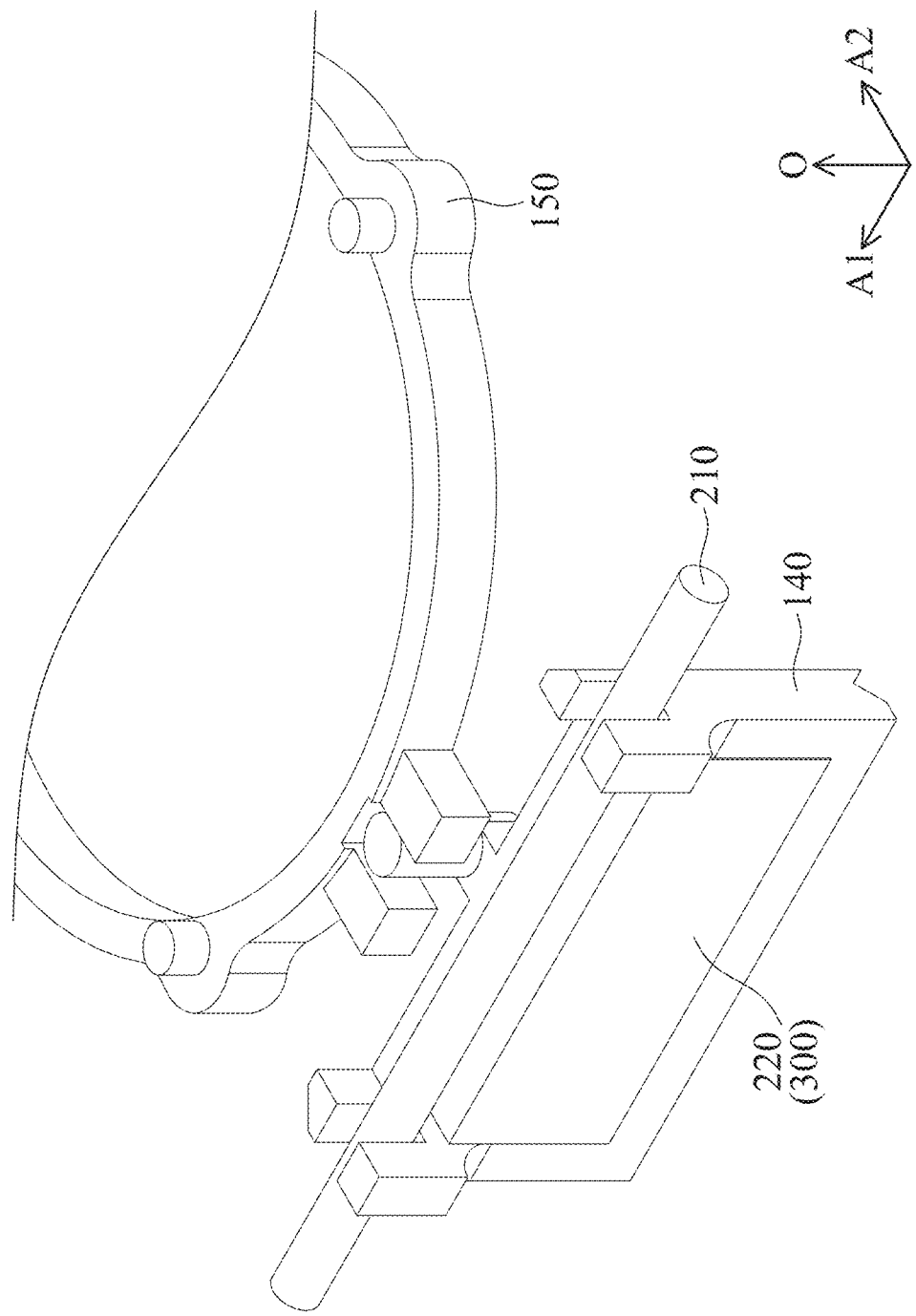

Next, in addition to FIG. 2 to FIG. 4, please also refer to FIG. 8 and FIG. 9 to know the first drive assembly D1 and the first sensing assembly S1. FIG. 8 and FIG. 9 are schematic views illustrating the driving and sensing of the first movable part M1. The first drive assembly D1 and the first sensing assembly S1 are located on the first side 1001.

The first optical element 10 is located above the first holder 150. The accommodation support 140 is located on the first side 1001 and located at one side of the first holder 150. The guidance element 210 and the first magnetic element 220 are located in the accommodation support 140. The guidance element 210 is located above the first magnetic element 220. The first coil 230 is disposed on the first circuit assembly C1 and located at one side of the first magnetic element 220. The first magnetic element 220 corresponds to the first coil 230 to generate a first driving force (the magnetic force). The first driving force drives the accommodation support 140 to move, and the guidance element 210 may guide the accommodation support 140 to move along the first axis A1. The first holder 150 is driven to move relative the immovable part I around the optical axis O by the contact force between the accommodation support 140 and the first holder 150, so that the first optical element 10 moves relative to the immovable part I due to the movement of the first holder 150, thereby controlling how much light enters the first optical element 10.

When the first movable part M1 moves relative to the immovable part I, the first sensing assembly S1 may sense the position of the first movable part M1. In detail, the first sensing element 310 corresponds to the first reference element 300. The first sensing element 310 may disposed inside the first coil 230, and the thickness of the first sensing element 310 is less than the thickness of the first coil 230. Therefore, the space may be utilized to achieve miniaturization.

The first sensing element 310 may be a Hall sensor, a giant magnetoresistive (GMR) sensor, a tunneling magnetoresistive (TMR) sensor, etc. A Hall sensor, a GMR sensor, or a TMR sensor means that other elements such as an amplifier circuit, a temperature-compensation circuit, and a power voltage-stabilization circuit are integrated into the sensor in addition to the Hall element, the GMR element, and the TMR element. Such a sensor is referred to as an All-in-One integrated circuit (All-in-One IC). After current is supplied to an All-in-One IC, the All-in-One IC may supply the current to the other elements. In some embodiments, the first sensing element 310 includes a plurality of pins. When the current from the first circuit assembly C1 is supplied to the first sensing element S1, at least two pins of the first sensing element 310 is used for supplying the current to the first coil 230. The first sensing element 310 may sense the change of the lines of magnetic field (including but not limited to the density of the lines of magnetic field and the direction of the lines of magnetic field) of the first reference element 300 to find out the position of the first holder 150.

It should be noted that, the first magnetic element 220 is the drive magnetic element of the first drive assembly D1 and also the reference element of the first sensing assembly S1. In this way, a single magnetic element may have multiple functions, so that the volume of the optical element drive mechanism 100 may be reduced to achieve miniaturization.

Figure 10:
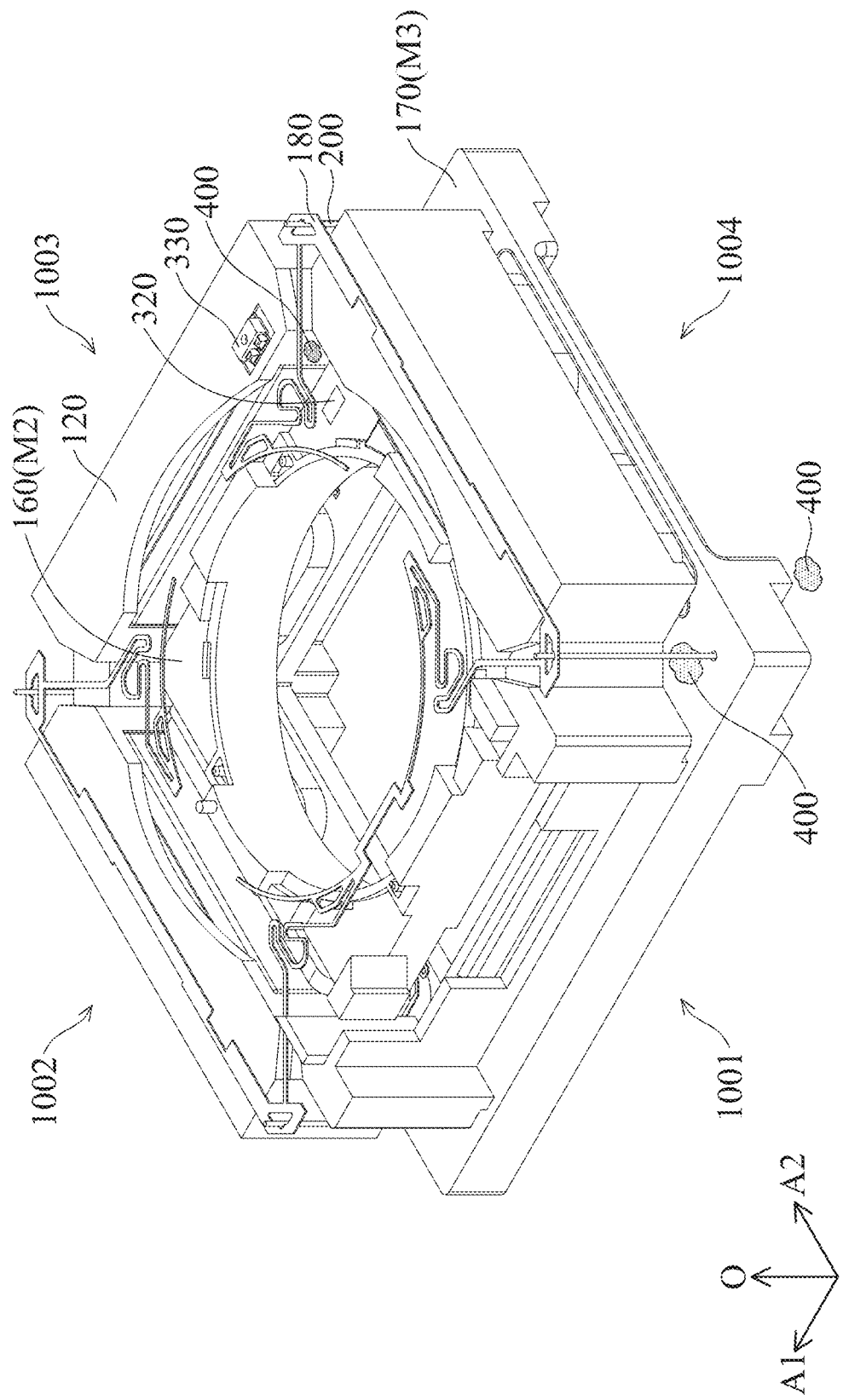
FIG. 10 to FIG. 12 are perspective views of the optical element drive mechanism with some elements omitted, and the omitted elements and the perspectives are not exactly the same.
Figure 11:
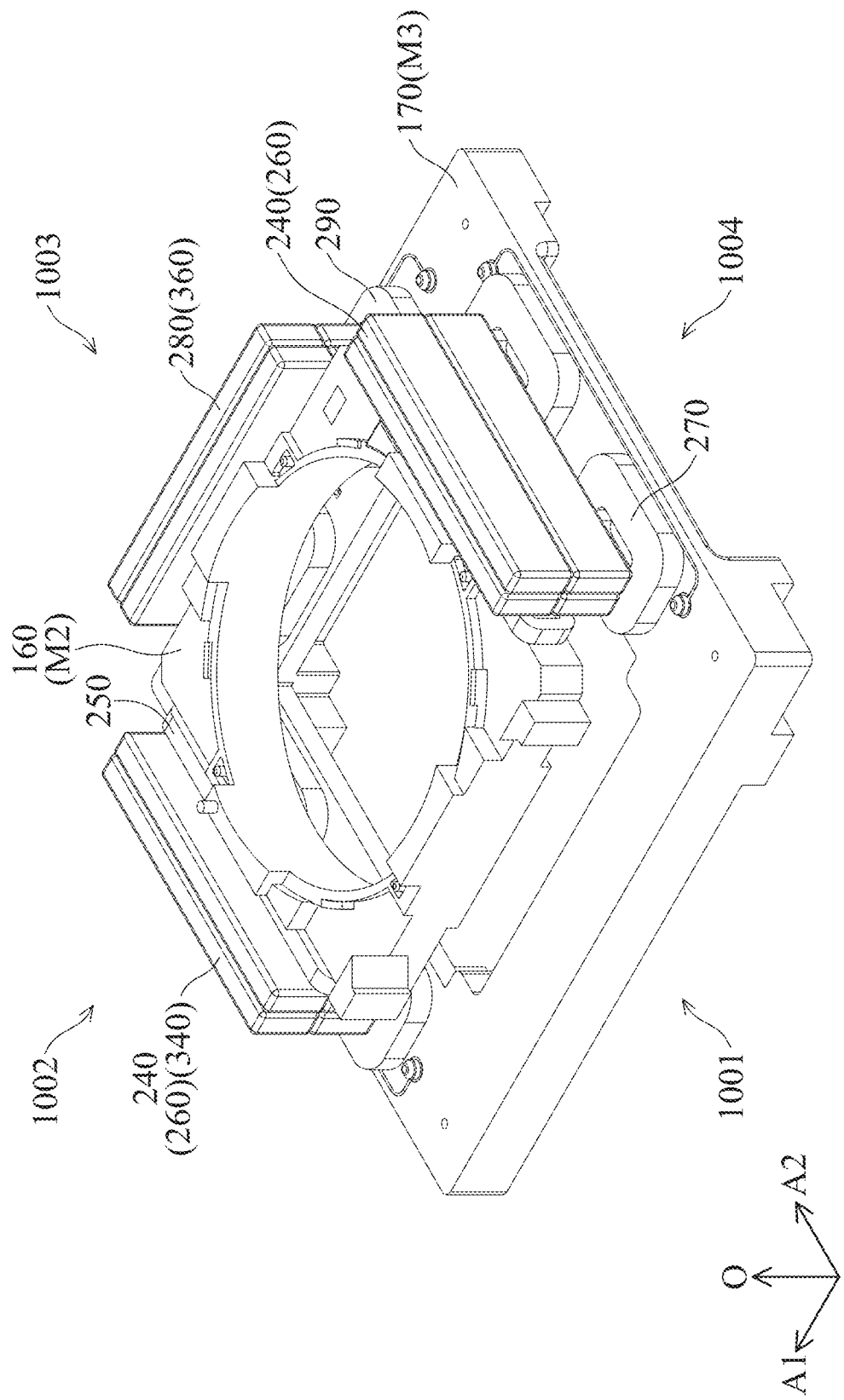
Figure 12:
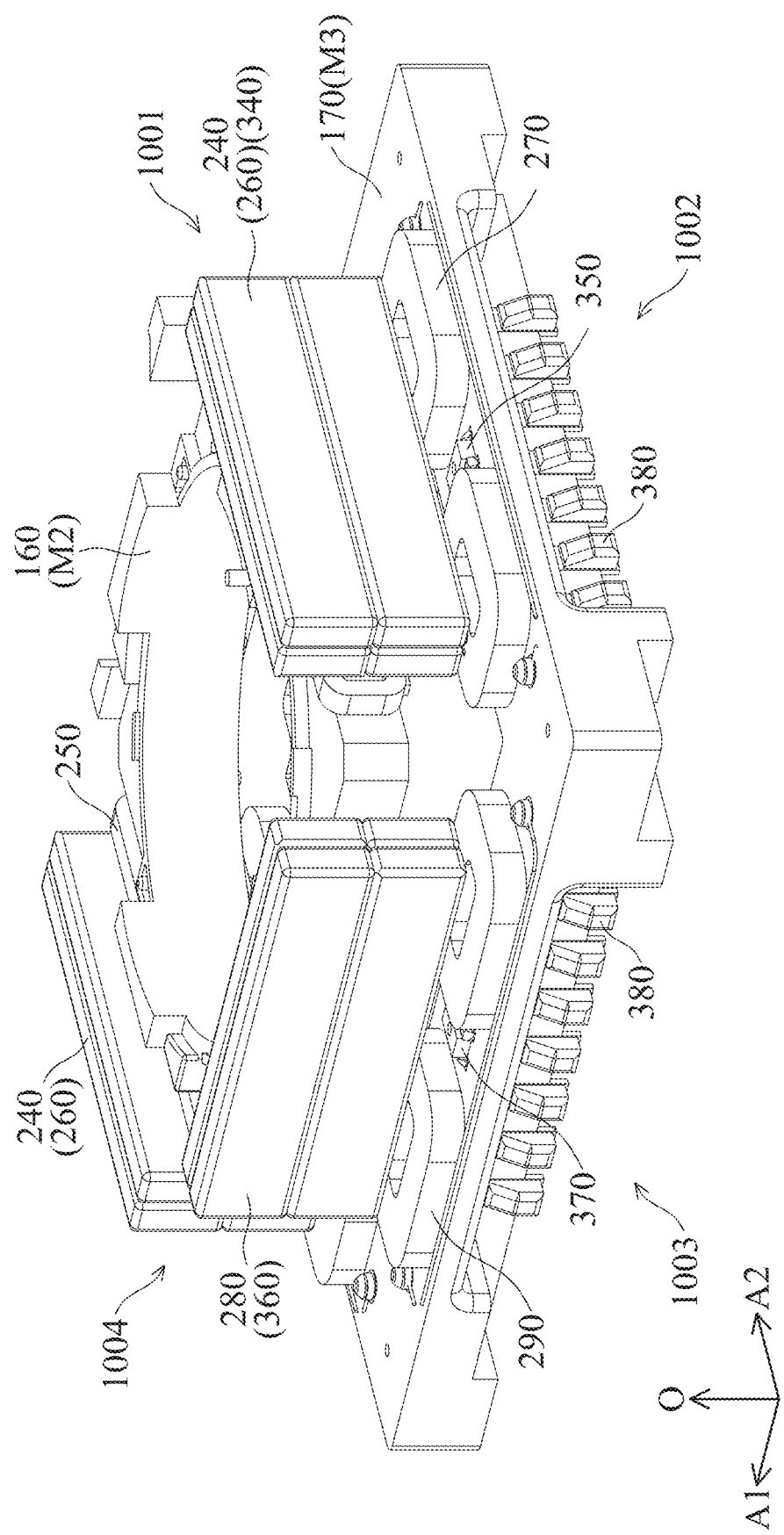
Figure 13:
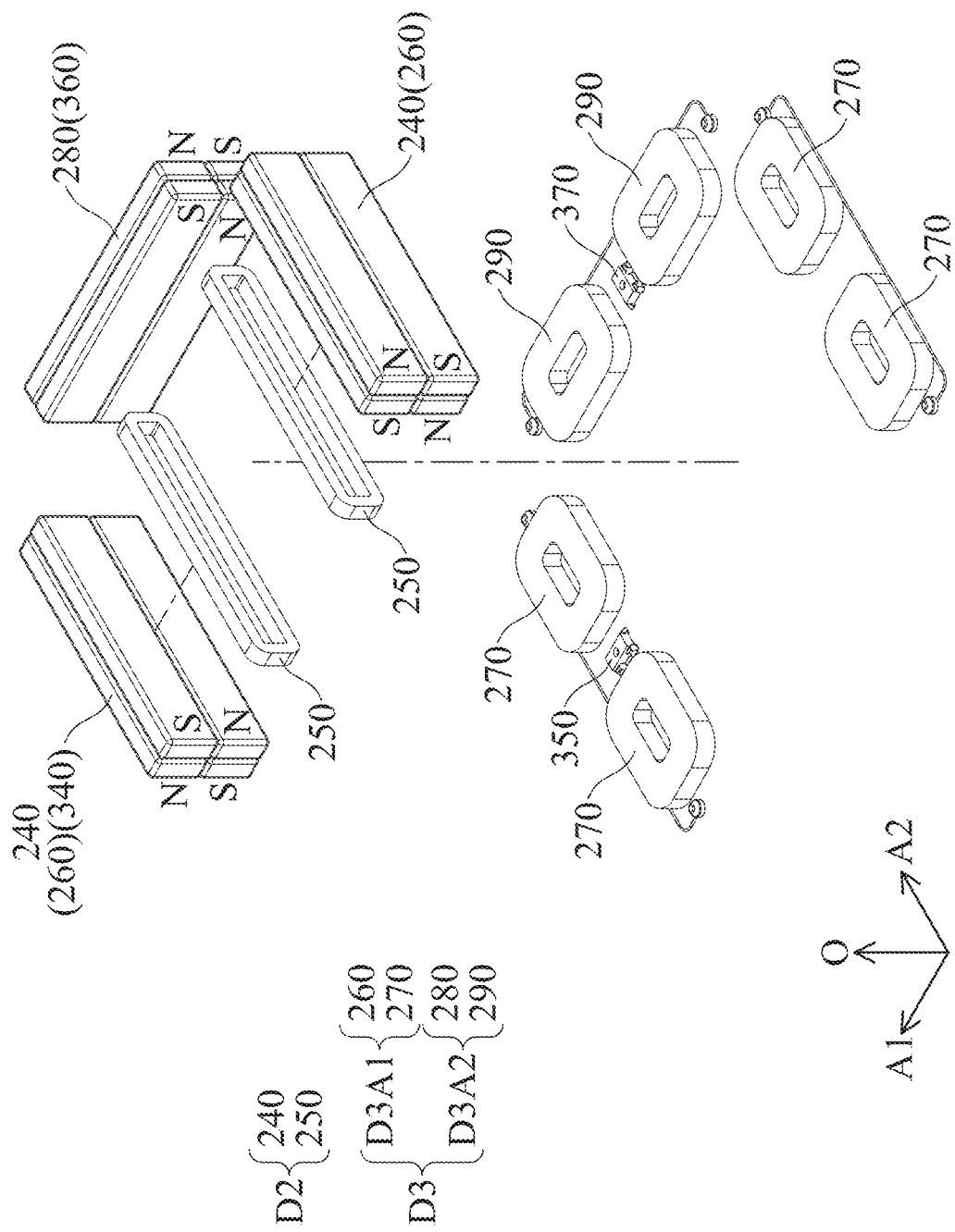
FIG. 13 is a schematic view illustrating the second drive assembly and the third drive assembly.

Next, in addition to FIG. 2 to FIG. 4, please also refer to FIG. 10 to FIG. 13 to know the second drive assembly D2, the third drive assembly D3, the second sensing assembly S2, and the third sensing assembly S3. FIG. 10 to FIG. 12 are perspective views of the optical element drive mechanism 100 with some elements omitted, and the omitted elements and the perspectives are not exactly the same. FIG. 13 is a schematic view illustrating the second drive assembly D2 and the third drive assembly D3.

The second drive assembly D2 is located on the second side 1002 and the fourth side 1004. The third drive assembly D3 is located on the second side 1002, the third side 1003, and the fourth side 1004. In detail, the first axis drive assembly D3A1 is located on the second side 1002 and the fourth side 1004, and the second axis drive assembly D3A2 is located on the third side 1003. Since the first drive assembly D1 is located on the first side 1001, and the second drive assembly D2 and the third drive assembly D3 are not disposed on the first side 1001, the magnetic interference may be reduced.

The second sensing assembly S2 is located on the third side 1003. The third sensing assembly S3 is located on the second side 1002 and the third side 1003. In detail, the first axis sensing assembly S3A1 is located on the second side 1002, and the second axis sensing assembly S3A3 is located on the third side 1003. In some other embodiments, the first axis sensing assembly S3A1 may be located on the fourth side 1004.

The second magnetic elements 240 are disposed in the frame 120. The second coils 250 are disposed on the electrical connection portions 163 of the second holder 160 and located at one side of each of the second magnetic elements 240. The second magnetic elements 240 correspond to the second coils 250 to generate a second driving force (the magnetic force). The second driving force may drive the second movable part M2 together with the second optical element 20 to move relative to the immovable part I along the optical axis O.

When the second movable part M2 moves relative to the immovable part I, the second sensing assembly S2 may sense the movement of the second movable part M2. In detail, the second sensing element 330 corresponds to the second reference element 320. The second sensing element 330 may be disposed on the frame concave portion 123. The second reference element 320 may be disposed on the second holder 160. The second sensing element 330 may be a Hall element, a GMR element, a TMR element, etc. The second sensing element 330 may sense the change of the lines of magnetic field (including but not limited to the density of the lines of magnetic field and the direction of the lines of magnetic field) of the second reference element 320 to find out the position of the second holder 160.

The third movable part M3 is disposed between the frame 120 and the bottom 130. The first axis magnetic elements 260 are disposed in the frame 120. The first axis coils 270 are disposed on the third movable part M3 and are located below the first axis magnetic elements 260. The first axis magnetic elements 260 correspond to the first axis coils 270 to generate a first axis driving force (the magnetic force). The first axis driving force may drive the third movable part M3 together with the third optical element 30 to move relative to the immovable part I along the first axis A1. Similarly, the second axis magnetic element 280 is disposed in the frame 120. The second axis coils 290 are disposed on the third movable part M3 and are located below the second axis magnetic element 280. The second axis magnetic element 280 corresponds to the second axis coils 290 to generate a second axis driving force (the magnetic force). The second axis driving force may drive the third movable part M3 together with the third optical element 30 to move relative to the immovable part I along the second axis A2.

When the third movable part M3 moves relative to the immovable part I, the third sensing assembly S3 (including the first axis sensing assembly S3A1 and the second axis sensing assembly S3A2) may sense the movement of the third immovable part M3. In detail, the first axis sensing element 350 corresponds to the first axis reference element 340. The first axis sensing element 350 may be disposed on the third movable part M3. The first axis sensing element 350 may be disposed between two of the first axis coils 270, and the thickness of the first axis sensing element 350 is less than the thickness of each of the first axis coils 270. Therefore, the space is utilized to achieve miniaturization. The first axis reference element 340 may be disposed in the frame 120. The first axis sensing element 350 may be a Hall element, a GMR element, a TMR element, etc. The first axis sensing element 350 may sense the change of the lines of magnetic field (including but not limited to the density of the lines of magnetic field and the direction of the lines of magnetic field) of the first axis reference element 340 to find out the position of the third holder 170 in the first axis A1.

Similarly, the second axis sensing element 370 corresponds to the second axis reference element 360. The second axis sensing element 370 may be disposed on the third movable part M3. The second axis sensing element 370 may be disposed between the two second axis coils 290, and the thickness of the second axis sensing element 370 is less than the thickness of each of the second axis coils 290. Therefore, the space is utilized to achieve miniaturization. The second axis reference element 360 may be disposed in the frame 120. The second axis sensing element 370 may be a Hall element, a GMR element, a TMR element, etc. The second axis sensing element 370 may sense the change the lines of magnetic field (including but not limited to the density of the lines of magnetic field and the direction of the lines of magnetic field) of the second axis reference element 360 to find out the position of the third holder 170 in the second axis A2.

It should be noted that, the second magnetic element 240 is the drive magnetic element of the second drive assembly D2 and also the drive magnetic element of the first axis drive assembly D3A1. In addition, the second axis magnetic element 280 is the drive magnetic element of the second axis drive assembly D3A2 and also the reference element of the second axis sensing assembly S3A2. Also, the second magnetic element 240 that is located on the second side 1002 is the reference element of the first axis sensing assembly S3A1. In this way, a single magnetic element may have multiple functions, so that the volume of the optical element drive mechanism 100 may be reduced to achieve miniaturization.

Since there is no need to place multiple magnetic elements for performing different functions, the magnetic elements (including but not limited to the second magnetic element 240 and the second axis magnetic element 280) may be a multi-pole magnet or may be formed by adhesion of multiple magnets. The magnetic poles (including a pair of north pole and south pole) are schematically illustrated in FIG. 13, but the actual configuration of the magnetic poles is not limited thereto.

In some embodiments, to increase the stability of the movement of the second movable part M2 and/or the third movable part M3 relative to the immovable part I, a plurality of buffer elements 400 (schematically illustrated in FIG. 10) may be placed at or close to the second movable part M2 and/or the third movable part M3. The buffer elements 400 may also be known as damping elements. The buffer elements are made of a material that may absorb shock and may inhibit vibration, such as a gel. When an external force affects the optical element drive mechanism 100, the buffer elements 400 may prevent a severe collision between the second movable part M2 and other elements and/or a severe collision between the third movable part M3 and other elements. Furthermore, the buffer elements 400 may help the second movable part M2 and/or the third movable part M3 to return to their original positions quickly. Therefore, the buffer elements 400 may improve the structural strength of the optical element drive mechanism 100.

In some embodiments, to prevent a severe collision occurred to the second movable part M2 when the second movable part M2 moves along the optical axis O, the buffer elements 400 may be disposed inside the frame 120 and above the second movable part M2. In some embodiments, to prevent a severe collision occurred to the third movable part M3 when the third movable part M3 moves in directions that are perpendicular to the optical axis O, the buffer elements 400 may be disposed outside the frame 120 and on the second movable part M2, or the buffer elements 400 may be disposed below the third movable pall M3.

Figure 14:
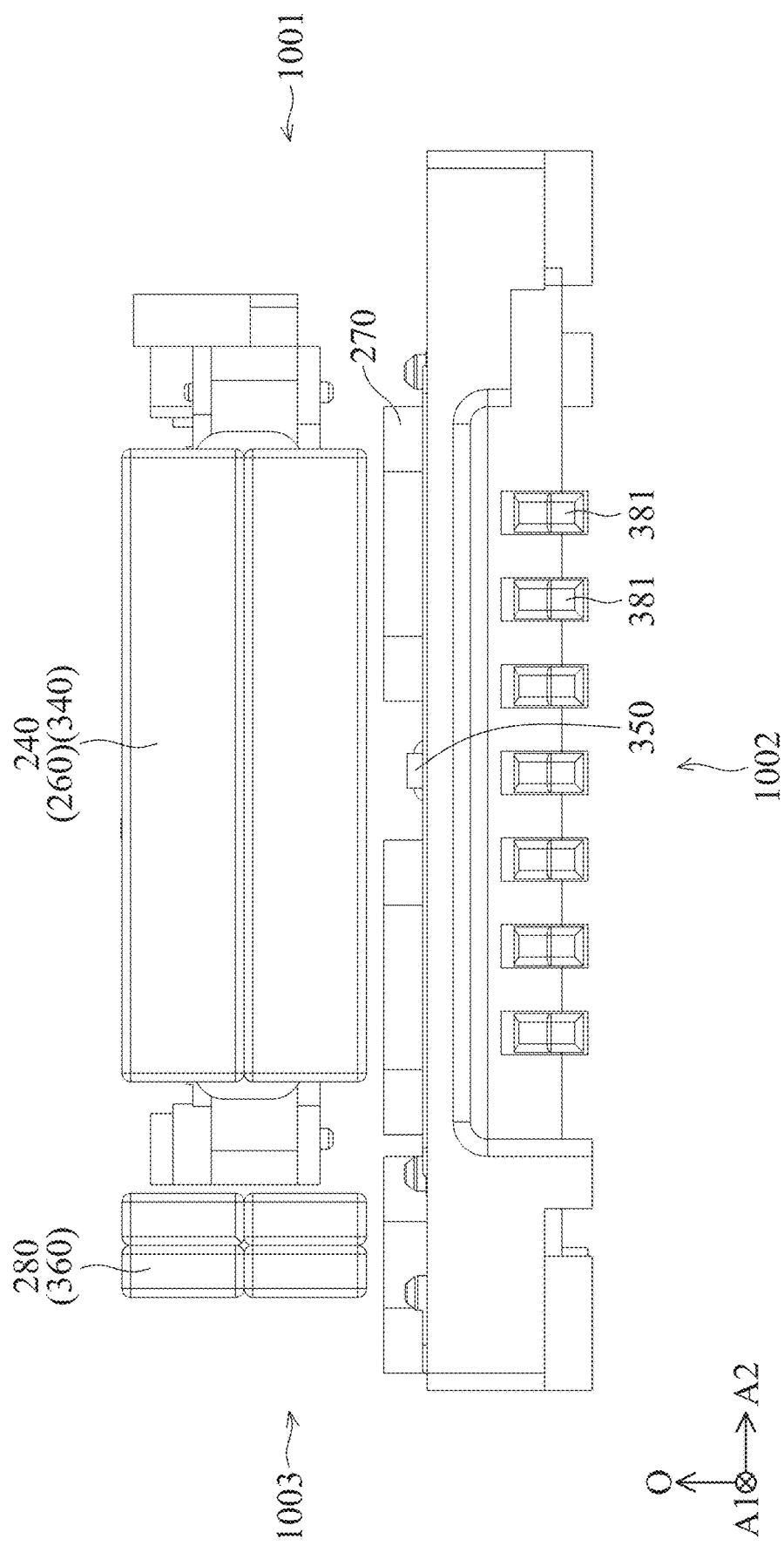
FIG. 14 and FIG. 15 are side views of the optical element drive mechanism from different perspectives with some elements omitted.
Figure 15:
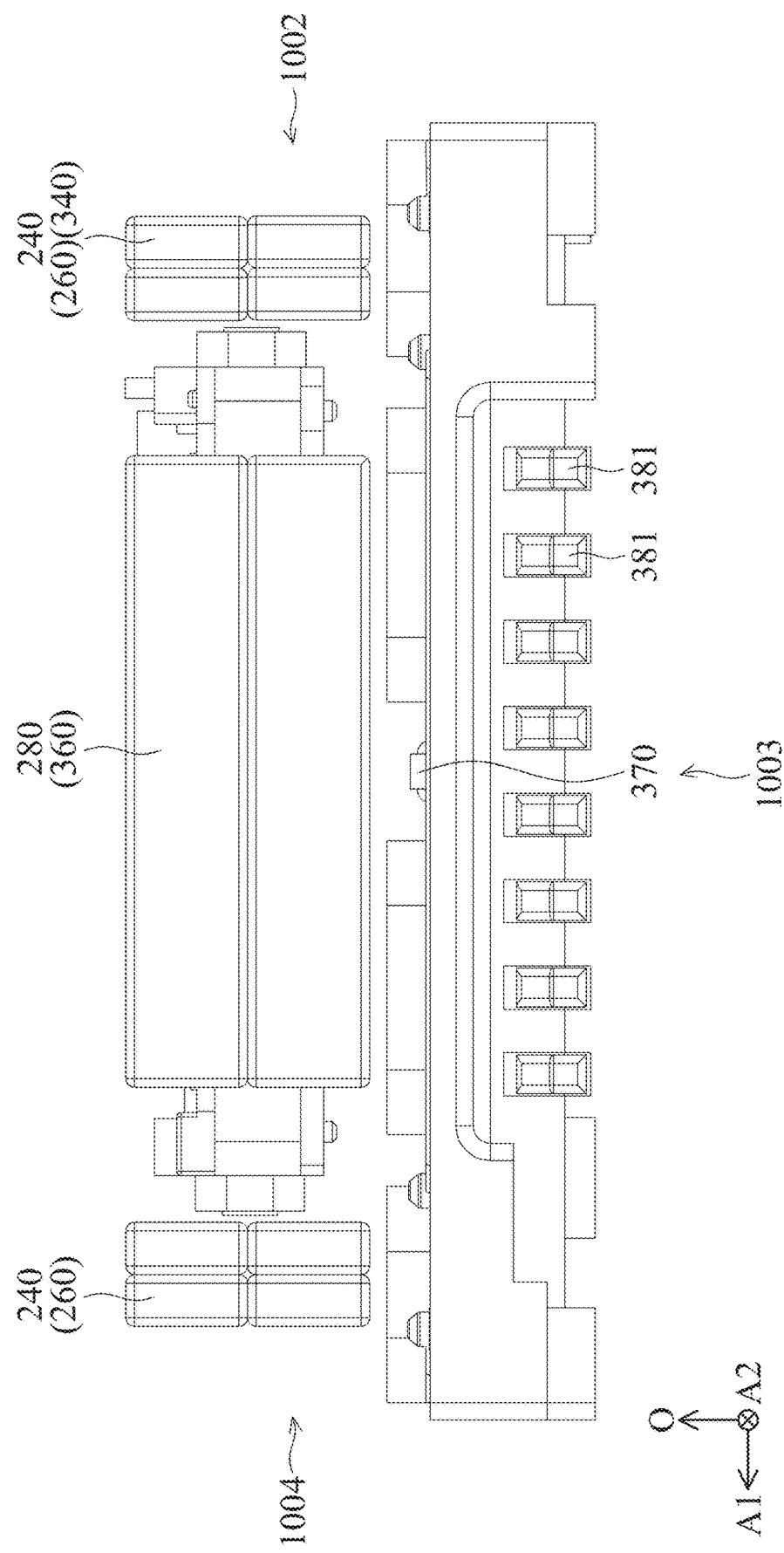

Next, please refer to FIG. 12. FIG. 14, and FIG. 15. FIG. 14 and FIG. 15 are side views of the optical element drive mechanism 100 from different perspectives with some elements omitted. The optical element drive mechanism 100 may further include an external connection circuit 380, so the optical element drive mechanism 100 may be electrically connected to an external circuit (not shown) that is outside the optical element drive mechanism 100. The external connection circuit 380 is located on the second side 1002 and the third side 1003. The external connection circuit 380 includes a plurality of external connection pins 381, so the current may flow in and out. As shown in FIG. 14 and FIG. 15, there are seven external connection pins 381 located on the second side 1002, and there are eight external connection pins 381 located on the third side 1003.

Among the seven external connection pins 381 that are located on the second side 1002, four external connection pins 381 are used for electrical connection to the four first axis coils 270, two external connection pins 381 are used for electrical connection to the two second axis coils 290, and the left one is used as a backup pin. Alternatively, the backup pin may be arranged on the third side 1003. Among the eight external connection pins 381 that are located on the third side 1003, four external connection pins 381 are used for electrical connection to the first axis sensing element 350, and the other four external connection pins 381 are used for electrical connection to the second axis sensing element 370. Since the external connection pins 381 that are located on the same side have similar functions and connection ways, the routing may be simplified and the interference may be reduced.

As described above, an optical element drive mechanism that is capable of driving multiple optical elements is provided. Different optical elements are driven by different drive assemblies, and the configuration of the drive assemblies may reduce magnetic interference. Also, the movement of different optical elements are sensed by different sensing assemblies, and the configuration of the sensing assemblies may utilize the space. In addition, the magnetic element of the drive assemblies and the magnetic element of the sensing assemblies may be commonly used to achieve miniaturization in a certain dimension or for overall miniaturization. Furthermore, the configuration of the external connection circuit may simplify the routing and reduce the interference.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and each claim constitutes a separate embodiment, and the combination of various claims and embodiments are within the scope of the disclosure.

What is claimed is:

1. An optical element drive mechanism, comprising:
   an immovable part;
   a first movable part connected to a first optical element, wherein the first movable part is movable relative to the immovable part;
   a second movable part connected to a second optical element that comprises an optical axis;
   a third movable part connected to a third optical element;
   a first drive assembly driving the first movable part to move relative to the immovable part;
   a second drive assembly driving the second movable part to move relative to the immovable part along the optical axis; and
   a third drive assembly driving the third movable part to move relative to the immovable part along a first axis and a second axis, wherein the first axis and the second axis are perpendicular to the optical axis;
   wherein the optical element drive mechanism is polygonal, comprising a first side, a second side, a third side, and a fourth side;
   wherein the first side is opposite and parallel with the third side, and the second side is opposite and parallel with the fourth side;
   wherein the first drive assembly is disposed on the first side;
   wherein the immovable part comprises a frame disposed above the third movable part, and the second movable part is disposed in the frame;
   wherein the third drive assembly comprises a first axis drive assembly, and the first axis drive assembly comprises:
   a first axis magnetic element disposed in the frame; and
   a first axis coil disposed on the third movable part, wherein the first axis magnetic element corresponds to the first axis coil to generate a first axis driving force, and the first axis driving force drives the third movable part to move relative to the immovable part along the first axis.

2. The optical element drive mechanism as claimed in claim 1, further comprising a fourth optical element, wherein the first optical element is located between the fourth optical element and the second optical element.

3. The optical element drive mechanism as claimed in claim 1, wherein the second drive assembly and the third drive assembly are not disposed on the first side.

4. The optical element drive mechanism as claimed in claim 1, wherein the first movable part comprises a first holder and an accommodation support, the first optical element is disposed on the first holder, and the accommodation support is disposed on a side of the first holder where the first driving assembly is disposed, wherein the first drive assembly comprises a guidance element, a first magnetic element, and a first coil, the first magnetic element and the guidance element are disposed in the accommodation support, the first magnetic element corresponds to the first coil to generate a first driving force, the first driving force drives the accommodation support to move, and the guidance element guides the accommodation support to move along the first axis, wherein the first holder is driven to move relative to the immovable part around the optical axis, so that the first optical element is driven to move relative to the immovable part by the movement of the first holder to control how much light enters the first optical element.

5. The optical element drive mechanism as claimed in claim 4, further comprising a first sensing assembly sensing the movement of the first movable part, wherein the first sensing assembly is disposed on the first side, and the first sensing assembly comprises:
a first reference element disposed in the first movable part; and
a first sensing element corresponding to the first reference element and disposed inside the first coil;
wherein a thickness of the first sensing element is less than a thickness of the first coil.

6. The optical element drive mechanism as claimed in claim 5, wherein the first sensing element comprises a plurality of pins, and current is supplied to the first coil via at least two of the pins.

7. The optical element drive mechanism as claimed in claim 1, wherein the second drive assembly is disposed on the second side and the fourth side, the second drive assembly comprises a second magnetic element and a second coil, the second magnetic element is disposed in the frame, the second coil is disposed on the second movable part, the second magnetic element corresponds to the second coil to generate a second driving force, and the second driving force drives the second movable part to move relative to the immovable part.

8. The optical element drive mechanism as claimed in claim 7, further comprising a second sensing assembly sensing the movement of the second movable part, wherein the second sensing assembly is disposed on the third side, and the second sensing assembly comprises:
a second reference element disposed on the second movable part; and
a second sensing element corresponding to the second reference element and disposed on the frame.

9. The optical element drive mechanism as claimed in claim 1, wherein the third drive assembly further comprises a second axis drive assembly, the first axis drive assembly is disposed on the second side and the fourth side, and the second axis drive assembly is disposed on the third side.

10. The optical element drive mechanism as claimed in claim 9, wherein the second axis drive assembly comprises a second axis magnetic element and a second axis coil, the second axis magnetic element is disposed in the frame, the second axis coil is disposed on the third movable part, the second axis magnetic element corresponds to the second axis coil to generate a second axis driving force, and the second axis driving force drives the third movable part to move relative to the immovable part along the second axis.

11. The optical element drive mechanism as claimed in claim 10, wherein the first axis is perpendicular to the second axis.

12. The optical element drive mechanism as claimed in claim 10, further comprising a third sensing assembly sensing the movement of the third movable part, wherein the third sensing assembly comprises a first axis sensing assembly and a second axis sensing assembly, the first axis sensing assembly is disposed on the second side or the fourth side, and the second axis sensing assembly is disposed on the third side.

13. The optical element drive mechanism as claimed in claim 12, wherein the first axis sensing assembly comprises a first axis sensing element, and the first axis sensing element corresponds to the first axis magnetic element, wherein there are a plurality of first coils, the first axis sensing element is disposed between the first coils, and a thickness of the first axis sensing element is less than a thickness of each of the first axis coils, wherein the second axis sensing assembly comprises a second axis sensing element, and the second axis sensing element corresponds to the second axis magnetic element, wherein there are a plurality of second coils, the second axis sensing element is disposed between the second coils, and a thickness of the second axis sensing element is less than a thickness of each of the second axis coils.

14. The optical element drive mechanism as claimed in claim 13, further comprising an external connection circuit, wherein the external connection circuit comprises a plurality of external connection pins, the external connection pins are located on the second side and the third side, wherein among the external connection pins that are located on the second side, at least four of them are electrically connected to the first axis coils, and at least two of them are electrically connected to the second axis coils.

15. The optical element drive mechanism as claimed in claim 14, wherein among the external connection pins that are located on the third side, at least four of them are electrically connected to the first axis sensing element, and at least four of them are electrically connected to the second axis sensing element.

16. The optical element drive mechanism as claimed in claim 1, further comprising a buffer element, wherein the buffer element is disposed inside the frame and on the second movable part.

17. The optical element drive mechanism as claimed in claim 1, further comprising a buffer element, wherein the buffer element is disposed outside the frame and on the third movable part.

18. The optical element drive mechanism as claimed in claim 1, further comprising a buffer element, wherein the buffer element is disposed below the third movable part.

* * * * *